US 6,559,679 B2

(12) United States Patent
Kim

(10) Patent No.: US 6,559,679 B2
(45) Date of Patent: May 6, 2003

(54) GLITCH FREE CLOCK MULTIPLEXER CIRCUIT AND METHOD THEREOF

(75) Inventor: Bong Kyun Kim, Gwacheon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/092,696

(22) Filed: Mar. 5, 2002

(65) Prior Publication Data

US 2002/0125914 A1 Sep. 12, 2002

(30) Foreign Application Priority Data

Mar. 8, 2001 (KR) ........................................ 2001-12010

(51) Int. Cl.[7] .............................................. H03K 19/096
(52) U.S. Cl. .......................................... 326/93; 326/96
(58) Field of Search ................................ 326/46, 93–98

(56) References Cited

U.S. PATENT DOCUMENTS

| | | | | |
|---|---|---|---|---|
| 5,604,452 A | * | 2/1997 | Huang | ........................ 327/99 |
| 5,652,536 A | * | 7/1997 | Nookala et al. | ............ 327/298 |
| 6,240,695 B1 | * | 6/2001 | Karalic et al. | ................ 52/690 |

* cited by examiner

Primary Examiner—Don Le
(74) Attorney, Agent, or Firm—Lee & Hong

(57) ABSTRACT

In a glitch free clock multiplexer circuit and a method thereof, the glitch free clock multiplexer circuit includes a delay unit for receiving asynchronous clock signals (Clock A, Clock B) and an external selection signal (Sel) and outputting a delay signal by delaying a clock signal selected by the external selection signal (Sel) for a certain clock cycle, a state region transition generating unit for comparing the delay signal with a count value provided from a user, outputting a first control signal (Sel_clock) according to a comparison value and a second control signal (enable) for controlling the first control signal in a logic low state, and a glitch removal unit for outputting a clock output signal (Clock_out) by performing an AND operation of a temporary clock signal (Temp_clock) selected by the first control signal and a third control signal generated by delaying the second control signal (enable) for a certain clock cycle. Accordingly, a glitch free clock signal can be outputted by removing a glitch occurred in a clock conversion due to a timing difference between a plurality of asynchronous clock signals and a selection signal.

18 Claims, 6 Drawing Sheets

GLITCH FREE CLOCK MULTIPLEXER CIRCUIT AND METHOD THEREOF

BACKGROUND OF THE INVENTION

1. Field of the Invention

The present invention relates to a glitch removal system, and in particular to a glitch free clock multiplexer circuit and a method thereof which are capable of removing a glitch of a clock signal occurred in a clock conversion due to a timing difference between asynchronous clock signals and a selected signal.

2. Description of the Prior Art

Generally, a customized ASIC (application specific integrated circuit) designed and produced for a specific user requires lots of clocks and clock conversions in system operation.

FIG. 1 is an exemplary view illustrating a clock selection method of the conventional multiplexer. As depicted in FIG. 1, the conventional multiplexer 1 receives asynchronous signals (Clock_A, Clock_B) and outputs one of the signals according to an external selection signal (Sel).

A timing of a clock using the multiplexer 1 will be described.

FIG. 2 is a timing chart illustrating a clock selection method using the conventional multiplexer. As depicted in FIG. 2, when an external selection signal is in a low state, the multiplexer 1 outputs a clock signal A (Clock_A), when an external selection signal is in a high state, the multiplexer 1 outputs a clock signal B (Clock_B).

However, while the clock signal is changed according to the external selection signal, a glitch 3 may occur or a duty 5 of the clock may be changed due to a timing difference between the asynchronous clock signals (Clock_A, Clock_B) and the external selection signal.

Accordingly, when a clock signal is changed by the conventional clock selection method, because a glitch may occur or a duty of a clock may be changed due to a timing difference between a plurality of asynchronous clock signals and an external selection signal, a system collision caused by an error output or an error operation may occur.

SUMMARY OF THE INVENTION

Accordingly, it is an object of the present invention to provide a glitch free clock multiplexer circuit and a method thereof which are capable of outputting a glitch free clock signal by receiving asynchronous clock signals, comparing a delay signal delayed for a certain clock cycle with a count value provided from a user, outputting a first control signal (Sel_clock) corresponded to a comparison result and outputting a second control signal (enable) for controlling the first control signal in a logic low state.

In order to achieve the above-mentioned object, a glitch free clock multiplexer circuit in accordance with the present invention includes a delay unit for receiving asynchronous clock signals (Clock A, Clock B) and an external selection signal (Sel) and outputting a delay signal by delaying the clock signal selected by the external selection signal (Sel) for a certain clock cycle, a state region transition generating unit for comparing the delay signal with a count value provided from a user, outputting a first control signal (Sel_clock) according to a comparison result and outputting a second control signal (enable) for controlling the first control signal in a logic low state, and a glitch removal unit for outputting a clock output signal (Clock_out) by performing an AND operation of a temporary clock signal (Temp_clock) selected by the first control signal and a third control signal generated by delaying the second control signal (enable) for a certain clock cycle.

In order to achieve the above-mentioned object, a glitch free clock method of a glitch free clock multiplexer circuit in accordance with the present invention includes receiving asynchronous clock signals and an external selection signal (Sel) and outputting a delay signal generated by delaying the clock signal for a certain clock cycle, comparing the delay signal with a count value provided from a user and outputting a first control signal (Sel_Clock) and a second control signal (enable) corresponded to the count value, and outputting a clock output signal (Clock_out) by performing an AND operation of a temporary clock signal (Temp_clock) selected by the first control signal (Sel_clock) and a third control signal (enable_2delay) generated by delaying the second control signal (enable) for a certain clock cycle when it is in a logic high state.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
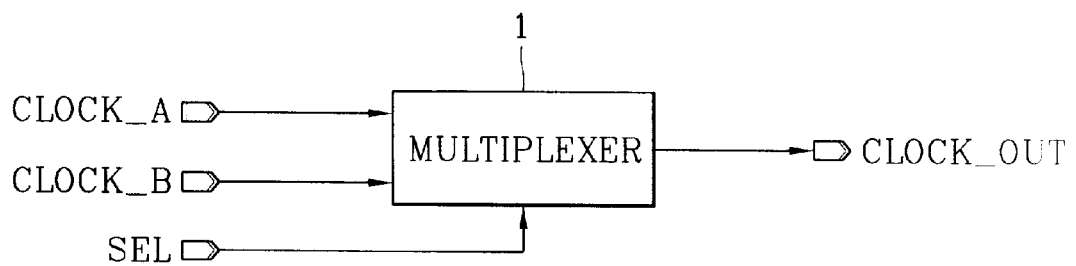
FIG. 1 is a examplary view illustrating a clock selection method of the conventional multiplexer.
Figure 2:
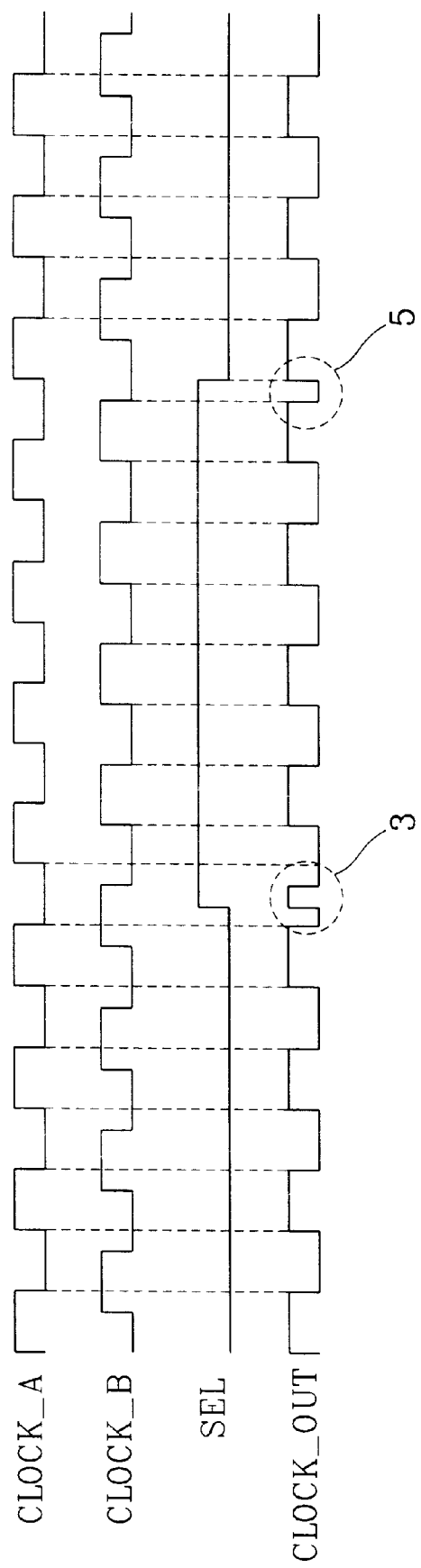
FIG. 2 is a timing chart illustrating a clock selection method using the conventional multiplexer.
Figure 3:
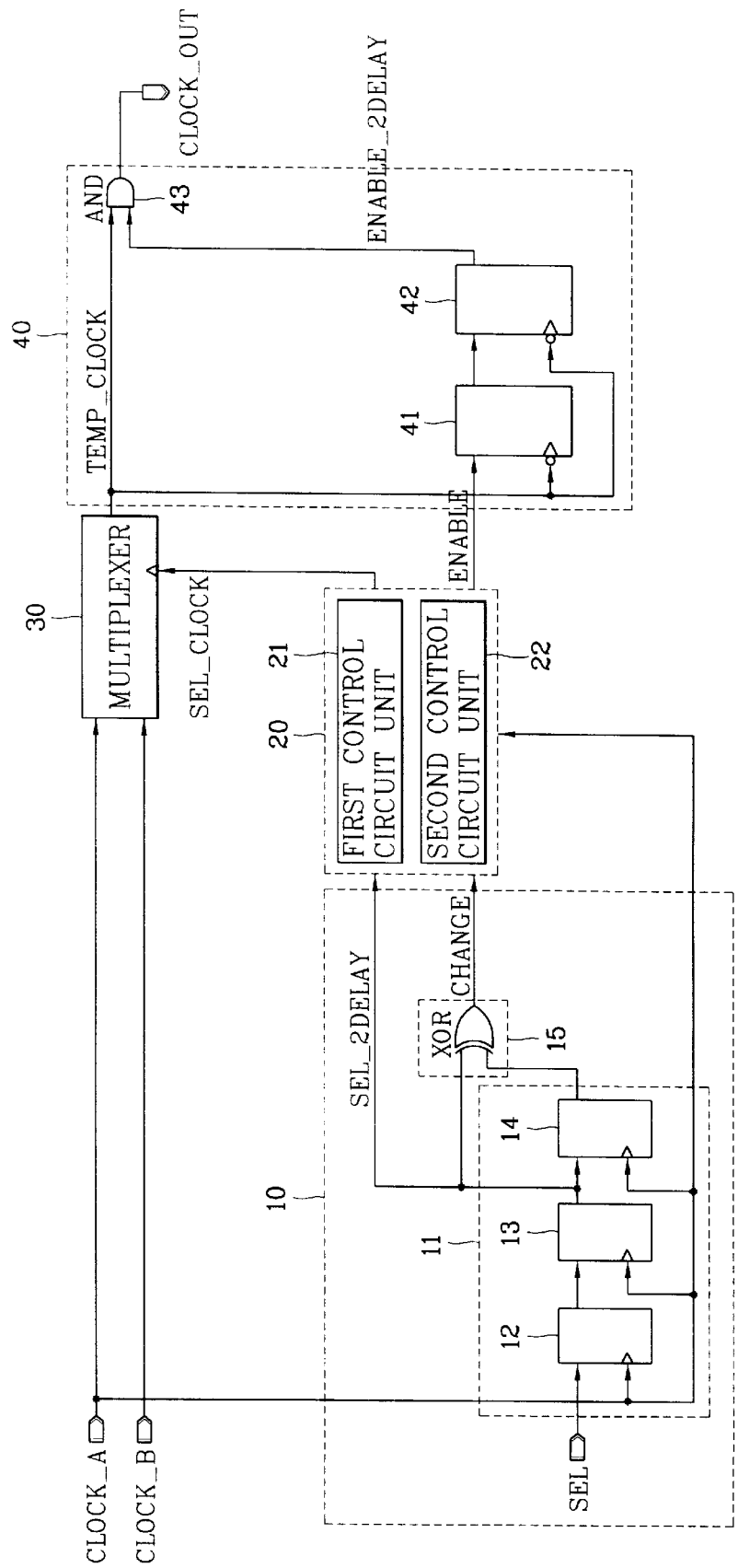
FIG. 3 is a block diagram illustrating a glitch free clock multiplexer circuit in accordance with present invention.

FIG. 3 is a block diagram illustrating a glitch free clock multiplexer circuit in accordance with present invention. As depicted in FIG. 3, a glitch free clock multiplexer circuit in accordance with present invention includes a delay unit 10 receiving asynchronous clock signals (Clock A, Clock B) and an external selection signal (Sel) and outputting a delay signal generated by delaying the clock signal selected according to the external selection signal (Sel) for a certain clock cycle, a state region transition generating unit 20 outputting a first control signal (Sel_clock) by comparing the delay signal with a count value provided from a user and outputting a second control signal (enable) for controlling the first control signal in a logic low state, a multiplexer 30 receiving the asynchronous clock signals and the first control signal (Sel_Clock) outputted from the state transition region generating unit 20, selecting one of the asynchronous clock signals and outputting it as a temporary clock signal (Temp_clock), and a glitch removal unit 40 outputting a clock output signal (Clock_out) by performing an AND operation of the temporary clock signal (Temp_clock)

selected by the first control signal (Sel_clock) and the third control signal (enable_2delay) generated by delaying the second control signal (enable) for a certain clock cycle.

Herein, the delay unit 10 includes a flip flop 11 delaying the asynchronous clock signal selected by the external selection signal (Sel) for a certain clock cycle and an exclusive logic gate 15 receiving the delayed clock signal and performing an exclusive OR operation.

In addition, the flip flop 11 includes a first D-flip flop 12 outputting a first delay signal (Sel_1delay) by delaying the asynchronous clock signal selected by the external selection signal (Sel) for a certain clock cycle, a second D-flip flop 13 outputting a second delay signal (Sel_2delay) by delaying the received first delay signal (Sel_1delay) for a certain clock cycle, and a third D-flip flop 14 outputting a third delay signal (Sel_3delay) by delaying the received second delay signal (Sel_2delay) for a certain clock cycle.

In addition, the state transition region generating unit 20 includes a first control circuit unit 21 changing a state of a clock signal region of the first control signal (Sel_clock) to a logic high state by the external selection signal (Sel) and outputting it when the count value is an intermediate value of the whole count signal region, and a second control circuit unit 22 resetting the count value and changing the state of the clock signal region of the second control signal (enable) to a logic high state and outputting it when the count value is the final value of the whole count signal region.

In addition, the glitch removal unit 40 includes filp flops 41, 42 outputting a third control signal (enable_2delay) generated by delaying the second control signal (enable) outputted from the state transition region regenerating unit 20 for a certain clock cycle, and an AND gate 43 receiving the delayed third control signal (enable_2delay) and the temporary clock signal (Temp_clock) and performing an AND operation of them.

The operation of the glitch free clock multiplexer circuit in accordance with the present invention will be described in detail with reference to accompanying FIG. 4.

Figure 4:
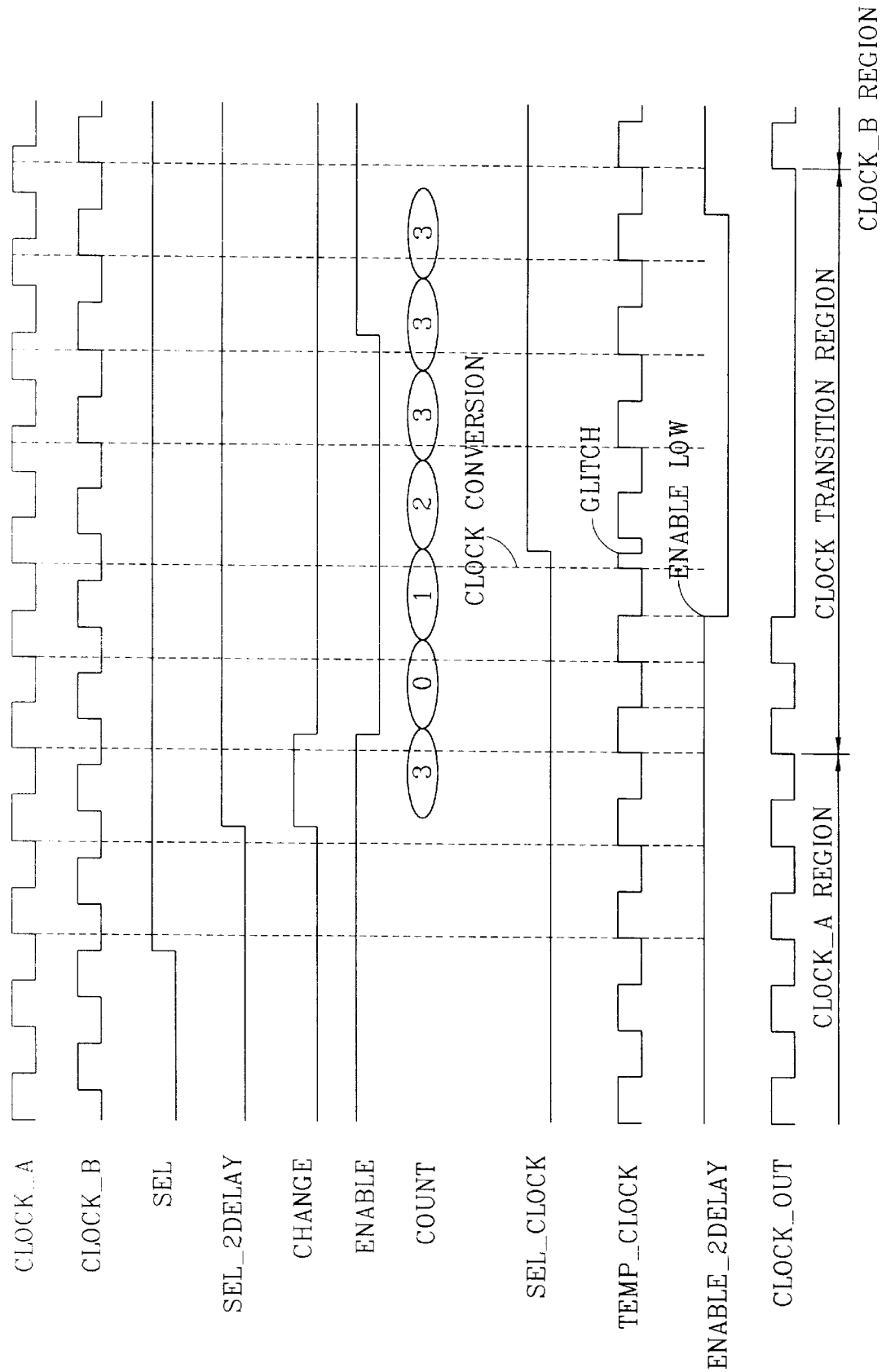
FIG. 4 is a timing chart illustrating a clock multiplexer using a glitch free circuit having a maximum count value as 3 in accordance with the present invention.

FIG. 4 is a timing chart illustrating a clock multiplexer using a glitch free circuit having a maximum count value as 3 in accordance with the present invention, herein the maximum count value is adjustable.

First, the delay unit 11 receives asynchronous clock signals (Clock A, Clock B) and an external selection signal (Sel) and outputs a delay signal by delaying the clock signal selected by the external selection signal (Sel) for a certain clock cycle.

In more detail, the delay unit 11 outputs a logic operation signal (Change) by performing an exclusive OR operation (XOR) of the second delay signal (Sel_2delay) generated by two clock cycle delay of the flip flop 11 and the third delay signal (Sel_3delay) generated by three clock cycle delay of the flip flop 11.

After, the state transition region generating unit 20 receives the second delay signal (Sel_2delay) and the logic operation signal (change), compares them with a count value provided from the user and outputs a first control signal (Sel_clock) and a second control signal (enable).

Herein, when the count value is an initial value of the whole count signal region, the second control signal (enable) is in a logic low state, when the count value is an intermediate value of the whole count signal region, the first control signal (Sel_clock) is changed, when the count value is the final value of the whole count signal region, the state of the second control signal (enable) is changed from the logic low state to the logic high state, herein the count value is reset.

Accordingly, the multiplexer 30 receives the first control signal (Sel_clock), selects one of the asynchronous clock signals (Clock a, Clock B) and outputs the selected signal as a temporary clock signal (Temp_clock).

After, a clock output signal (Clock_out) at which a glitch is removed is outputted by performing an AND operation of the temporary clock signal (Temp_clock) and the third control signal (enable_2delay) generated by delaying the second control signal (enable) for a certain clock cycle in the AND gate 43. Herein, the third control signal (enable_2delay) is generated by delaying the second control signal (enable) on the basis of a low edge of the temporary clock signal (Temp_clock).

Figure 5:
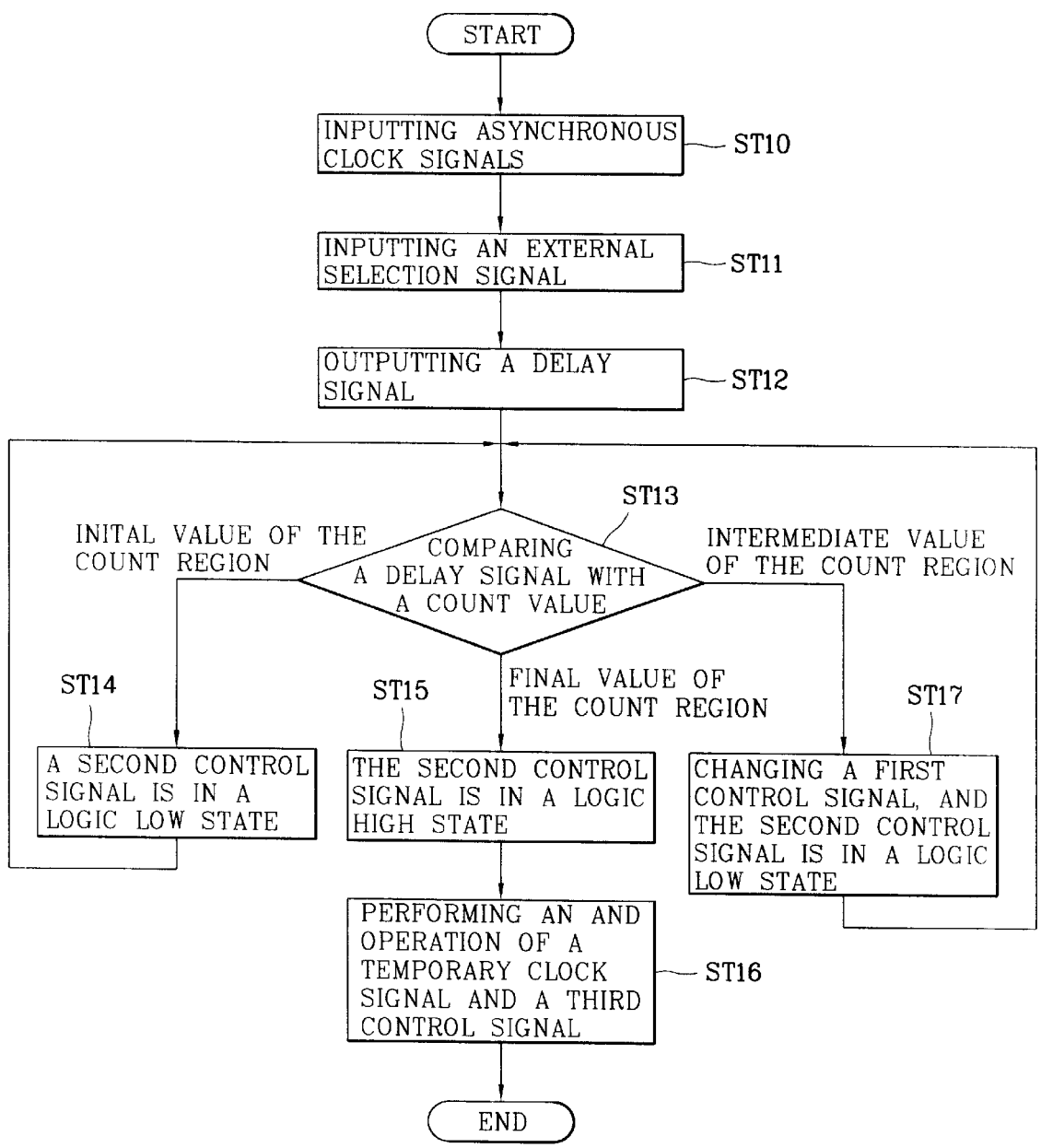
FIG. 5 is a flow chart illustrating a glitch free method of the glitch free clock multiplexer circuit in accordance with the present invention.

FIG. 5 is a flow chart illustrating a glitch free method of a glitch free clock multiplexer circuit in accordance with the present invention. As depicted in FIG. 5, a glitch free method in accordance with the present invention includes receiving asynchronous clock signals and an external selection signal (Sel) and outputting a delay signal generated by delaying the clock signal for a certain clock cycle as shown at steps ST10~ST12, outputting a first control signal (Sel_clock) and a second control signal (enable) corresponded to a count value after comparing the delay signal with the count value provided from the user as shown at step ST13, outputting the second control signal (enable) in a logic low state when the count value is an initial value of the whole count signal region as shown at step ST14, changing the first control signal (Sel_clock) when the count value is an intermediate value of the whole count signal region as shown at step ST17, resetting the count value and changing a state of the second control signal from the logic low state to a logic high state as shown at step ST15, and outputting a clock output signal (Clock_out) by performing an AND operation of the temporary clock signal (Temp_clock) selected by the first control signal (Sel_clock) and the third control signal (enable_2delay) generated by delaying the second control signal (enable) for a certain clock cycle when it is in the logic high state as shown at step ST16.

The operation of the state transition region regenerating unit of the glitch free clock multiplexer circuit will be described in detail with reference to accompanying FIG. 6.

Figure 6:
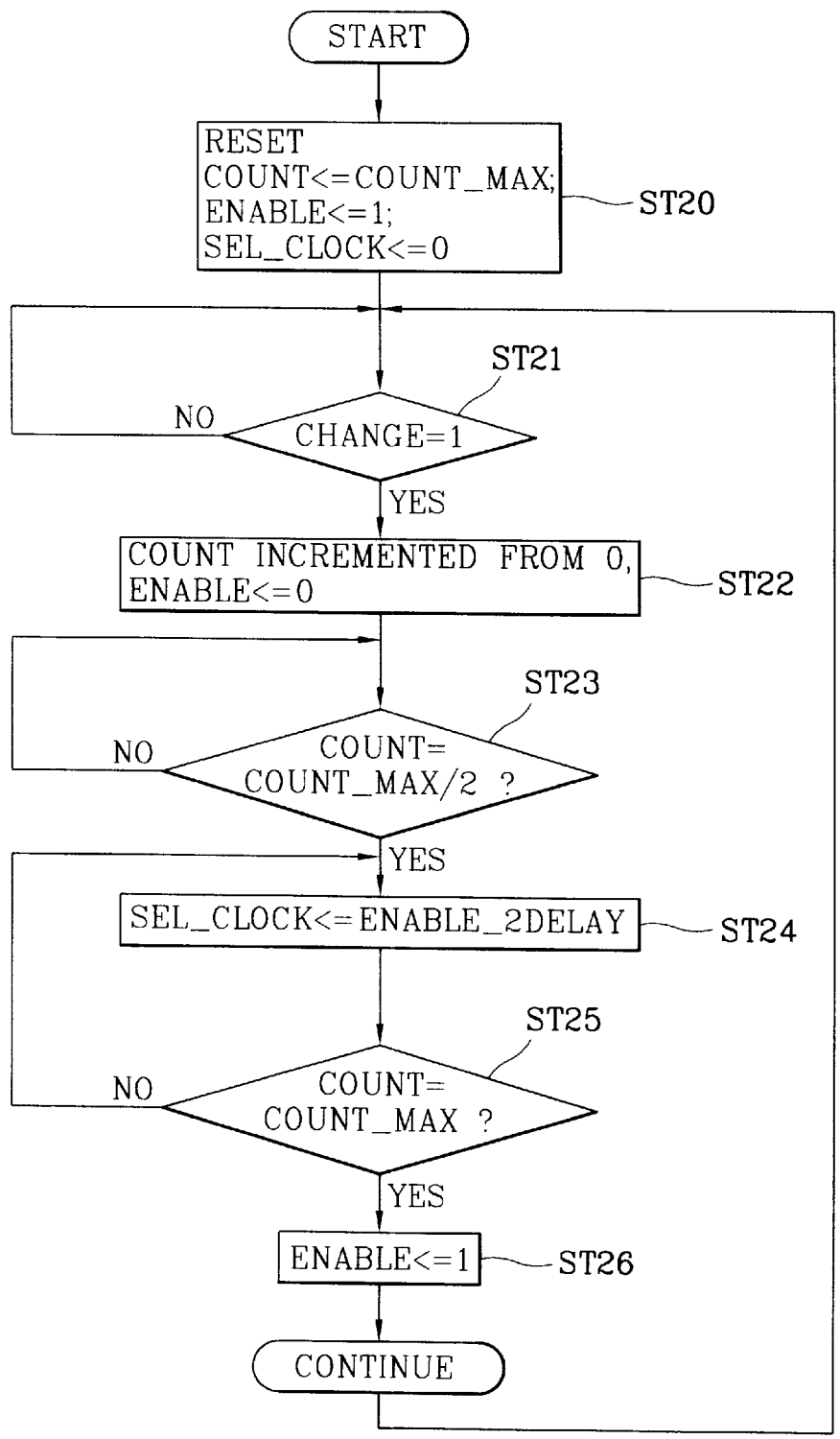
FIG. 6 is a flow chart illustrating an operation of a state transition region generating unit of the glitch free clock multiplexer circuit in accordance with the present invention.

FIG. 6 is a flow chart illustrating an operation of a state transition region generating unit of the glitch free clock multiplexer circuit in accordance with the present invention. As depicted in FIG. 6, when an external selection signal is changed by a selection pin, a logic operation signal is in a logic high state, from that a state transition region is started as shown at steps ST20, ST21.

Herein, a count value increases as an increment of 1, the second control signal (enable) is in a logic low state, and the clock output signal (clock_out) maintains a logic low state as shown at step ST22.

After, when the count value reaches an intermediate of the whole region (0~3), the first control signal (Sel-clock) is changed according to a selection signal of the external selection pin, the temporary clock signal (temp_clock) of the multiplexer 30 is changed to the clock signal A (clock_A) or the clock signal B (clock_B) while generating a glitch as shown at step ST23. However, the clock output signal (clock_out) waits until the clock signal (enable_2delay) is in the logic high state while maintaining the logic low state as shown at step ST24.

When the count value reaches the end of the whole region (0~3), the count value is reset, the second control signal (enable) is changed from the logic low state to the logic high state and is delayed for a certain clock, and the clock output signal (clock_out) is operated as the selected clock as shown at steps ST25, ST26.

After, while the temporary clock signal (Temp_clock) of the multiplexer 30 is outputted, the glitch removal unit 40 outputs the third control signal (enable_2delay) generated by delaying the second control signal (enable) in the logic high state in the D-filp flop. Accordingly, a glitch free clock signal is obtained by performing an AND operation of the temporary clock signal (temp_clock) and the third control signal (enable_2delay) in the AND gate 43.

As described above, in the present invention, a glitch free clock signal can be outputted by removing a glitch occurred in a clock conversion due to a timing difference between a plurality of asynchronous clock signals and a selection signal by outputting a first control signal (Sel_clock) by comparing a delay signal with a count value provided from a user and outputting a second control signal (enable) for controlling the first control signal in a logic low state.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A glitch free clock multiplexer circuit, comprising:
    a delay unit for receiving asynchronous clock signals (Clock A, Clock B) and an external selection signal (Sel) and outputting a delay signal generated by delaying the clock signal selected by the external selection signal (Sel) for a certain clock cycle;
    a state region transition generating unit for comparing the delay signal with a count value provided from a user, outputting a first control signal (Sel_clock) according to a comparison result and outputting a second control signal (enable) for controlling the first control signal in a logic low state; and
    a glitch removal unit for outputting a clock output signal (Clock_out) by performing an AND operation of a temporary clock signal (Temp_clock) selected by the first control signal and a third control signal generated by delaying the second control signal (enable) for a certain clock cycle.

2. The glitch free clock multiplexer circuit of claim 1, further comprising:
    a multiplexer for receiving the asynchronous clock signals (Clock A, Clock B) and the first control signal (Sel_clock) outputted from the state transition region generating unit, selecting one of the asynchronous clock signals and outputting the selected signal as a temporary clock signal (Temp_clock).

3. The glitch free clock multiplexer circuit of claim 1, wherein the delay unit includes:
    a flip flop for delaying the asynchronous clock signal selected by the external selection signal (Sel) for a certain clock cycle; and
    an exclusive logic gate for receiving the delayed clock signal and performing an exclusive OR operation.

4. The circuit glitch free clock multiplexer circuit of claim 3, wherein the flip flop includes:
    a first D-flip flop for outputting a first delay signal (Sel_1delay) generated by delaying the asynchronous clock signal selected by the external selection signal (Sel) for a certain clock cycle;
    a second D-flip flop for outputting a second delay signal (Sel_2delay) generated by receiving the first delay signal (Sel_1delay) and delaying it for a certain clock cycle; and
    a third D-flip flop for outputting a third delay signal (Sel_3delay) generated by receiving the second delay signal (Sel_2delay) and delaying it for a certain clock cycle.

5. The glitch free clock multiplexer circuit of claim 1, wherein the delay signal outputted from the delay unit is a second delay signal (Sel_2delay) generated by two clock cycle delay of the flip flop and a logic operation signal (Change) for performing an exclusive OR operation of the delayed clock signal and a clock signal generated by three clock cycle delay of the flip flop.

6. The glitch free clock multiplexer circuit of claim 1, wherein the second control signal (enable) is in a logic low state when the count value is an initial value of the whole count signal region in the state transition region generating unit.

7. The glitch free clock multiplexer circuit of claim 1, wherein the first control signal (Sel_clock) is changed when the count value is an intermediate value of the whole count signal region in the state transition region generating unit.

8. The glitch free clock multiplexer circuit of claim 1, wherein the count value is reset and the second control signal (enable) is changed from the logic low state to a logic high state when the count value is the final value of the whole count signal region in the state transition region generating unit.

9. The glitch free clock multiplexer circuit of claim 1, wherein the state transition region generating unit includes:
    a first control circuit unit for changing a state of a clock signal region of the second control signal to a logic low state and outputting it when the count value is an initial value of the whole count signal region, changing a state of a clock signal region of the first control signal (Sel_clock) to a logic high state by the external selection signal (Sel) and outputting it when the count value is an intermediate value of the whole count signal region; and
    a second control circuit unit for resetting the count value when the count value is the final value of the whole count signal region, changing a state of the clock signal region of the second control signal to a logic high state and outputting it.

10. The glitch free clock multiplexer circuit of claim 1, wherein the glitch removal unit includes:
    a flip flop for outputting a third control signal (enable_2delay) by delaying the second control signal (enable) outputted from the state transition region generating unit for a certain clock cycle; and
    an AND gate for receiving the third control signal (enable_2delay) and the temporary clock signal (Temp_clock) and performing an AND operation of them.

11. The glitch free clock multiplexer circuit of claim 1, wherein the third control signal (enable_2delay) generated by delaying the second control signal (enable) for the certain clock cycle is delayed on the basis of a low edge of the temporary clock signal (Temp_clock).

12. A glitch free clock multiplexer circuit, comprising:
    a delay unit for receiving asynchronous clock signals and an external selection signal, generating a second delay signal (Sel_2delay) and a third delay signal (Sel_3delay) by delaying the asynchronous clock signal selected by the external selection signal for a certain clock cycle, and outputting a logic operation signal (change) by performing a logic operation of the second delay signal and the third delay signal;

a state region transition generating unit for receiving the second delay signal (Sel_2delay) and the logic operation signal (change), comparing them with a count value provided from a user, outputting a first control signal (Sel_clock) according to a comparison result and outputting a second control signal (enable) for controlling the first control signal in a logic low state;

a multiplexer for receiving the first control signal (Sel_clock), selecting one of the asynchronous clock signals and outputting it as a temporary clock signal (Temp_clock); and a glitch removal unit for outputting a clock output signal (Clock_out) by performing an AND operation of the temporary clock signal (Temp_clock) and the third control signal (enable_2delay) generated by delaying the second control signal (enable) for a certain clock cycle.

13. A method for removing a glitch of a clock, comprising:

receiving asynchronous clock signals and an external selection signal (Sel) and outputting a delay signal generated by delaying the clock signal for a certain clock cycle;

comparing the delay signal with a count value provided from a user and outputting a first control signal (Sel_clock) and a second control signal (enable) corresponded to the count value; and outputting a clock output signal (Clock_out) by performing an AND operation of a temporary clock signal (Temp_clock) selected by the first control signal (Sel_clock) and a third control signal (enable_2delay) generated by delaying the second control signal (enable) for a certain clock cycle when it is in a logic high state.

14. The method of claim 13, wherein the second control signal (enable) is in a logic low state when the count value is an initial value of the whole count signal region in the first control signal (Sel-clock) and the second control signal (enable) outputting step.

15. The method of claim 13, wherein the first control signal (Sel_clock) is changed when the count value is an intermediate value of the whole count signal region in the first control signal (Sel-clock) and the second control signal (enable) outputting step.

16. The method of claim 13, wherein the count value is reset and the second control signal (enable) is in a logic high state when the count value is the last value of the whole count signal region in the first control signal (Sel-clock) and the second control signal (enable) outputting step.

17. The method of claim 13, wherein the clock output signal (Clock out) is outputted by performing an AND operation of the temporal clock signal (temp clock) and the third control signal (enable_2delay) generated by delaying the second control signal (enable) for two clock cycles on the basis of a low edge of the temporal clock signal (temp_clock).

18. The method of claim 13, wherein the logic high of the third control signal (enable_2delay) occurs at a falling edge of the temporary clock signal (Temp_clock).

* * * * *